(12) United States Patent
Ke

(10) Patent No.: US 11,991,917 B2
(45) Date of Patent: May 21, 2024

(54) DISPLAY PANEL AND MANUFACTURING METHOD THEREOF

(71) Applicant: Wuhan China Star Optoelectronics Semiconductor Display Technology Co., Ltd., Hubei (CN)

(72) Inventor: Linbo Ke, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/283,057

(22) PCT Filed: Mar. 16, 2021

(86) PCT No.: PCT/CN2021/080918
§ 371 (c)(1),
(2) Date: Apr. 6, 2021

(87) PCT Pub. No.: WO2022/188193
PCT Pub. Date: Sep. 15, 2022

(65) Prior Publication Data
US 2024/0023421 A1 Jan. 18, 2024

(30) Foreign Application Priority Data
Mar. 8, 2021 (CN) .......................... 202110249634.0

(51) Int. Cl.
*H10K 77/10* (2023.01)
*H10K 71/20* (2023.01)
*H10K 102/00* (2023.01)

(52) U.S. Cl.
CPC ......... *H10K 77/111* (2023.02); *H10K 71/221* (2023.02); *H10K 2102/311* (2023.02); *H10K 2102/351* (2023.02)

(58) Field of Classification Search
CPC . H01L 27/1218; H01L 27/1262; H10K 59/12; H10K 59/1201; H10K 71/221; H10K 77/111
(Continued)

(56) References Cited

U.S. PATENT DOCUMENTS

2008/0085418 A1  4/2008  Fukuda et al.
2011/0198627 A1  8/2011  Maindron et al.
(Continued)

FOREIGN PATENT DOCUMENTS

CN    1612648    5/2005
CN    103474583  12/2013
(Continued)

OTHER PUBLICATIONS

Wang et al., Flat Panel Display Suspicion Handbook, 1: 51-53, Dec. 30, 2016. (2 pages).
(Continued)

*Primary Examiner* — Fazli Erdem

(57) ABSTRACT

A display panel and a manufacturing method thereof are provided. The display panel includes a first flexible layer, a first barrier layer disposed on the first flexible layer, and a second flexible layer disposed on the first barrier layer. Wherein, a material of the first barrier layer includes silicon oxide and silicon nitride, a mass ratio of silicon oxide to silicon nitride is 3x:7y, and x=1 to 4 and y=1 to 4. The present disclosure can improve adhesion between the two flexible layers by disposing the barrier layer between the two flexible layers, thereby allowing a flexible substrate to have an ability to block water and oxygen, good adhesion, bending performance, high-temperature and high-humidity resistance, and optical transmittance.

9 Claims, 3 Drawing Sheets

(58) Field of Classification Search
USPC .......................................................... 257/40
See application file for complete search history.

(56) References Cited

U.S. PATENT DOCUMENTS

| | | | |
|---|---|---|---|
| 2016/0059261 A1 | | 3/2016 | Nishio |
| 2020/0185627 A1 | | 6/2020 | Fang |
| 2021/0408408 A1 | * | 12/2021 | Ke .................... H10K 77/111 |

FOREIGN PATENT DOCUMENTS

| | | | |
|---|---|---|---|
| CN | 103500745 | | 1/2014 |
| CN | 103681694 | | 3/2014 |
| CN | 103779390 | | 5/2014 |
| CN | 103855321 | * | 6/2014 |
| CN | 104425735 | | 3/2015 |
| CN | 107393859 | | 11/2017 |
| CN | 107680994 | | 2/2018 |
| CN | 109560088 | | 4/2019 |
| CN | 110034150 | | 7/2019 |
| CN | 110391294 | | 10/2019 |
| CN | 110473964 | | 11/2019 |
| CN | 111755624 | * | 10/2020 |
| WO | WO 2014/082300 | | 6/2014 |
| WO | WO 2014/082306 | | 6/2014 |

OTHER PUBLICATIONS

Yuan et al., Nanotechnology and Applications, p. 476-477, Jun. 30, 2019. (4 pages).

\* cited by examiner

DISPLAY PANEL AND MANUFACTURING METHOD THEREOF

RELATED APPLICATIONS

This application is a National Phase of PCT Patent Application No. PCT/CN2021/080918 having International filing date of Mar. 16, 2021, which claims the benefit of priority of Chinese Patent Application No. 202110249634.0 filed on Mar. 8, 2021. The contents of the above applications are all incorporated by reference as if fully set forth herein in their entirety.

FIELD AND BACKGROUND OF THE INVENTION

The present disclosure relates to the field of display technologies, and more particularly, to a display panel and a manufacturing method thereof.

With rapid development of modern display technologies, the field of display technologies is developing toward a direction of being lighter, thinner, more flexible, and more transparent. Conventional glass substrates are difficult to meet requirements of future flexible display technologies due to their characteristics such as hardness and brittleness. However, polymer thin film substrates have characteristics such as lightweightness, flexibility, and excellent comprehensive performances, so they can well meet requirements of the display technologies for flexibility. Therefore, flexible polymer substrate materials are materials of choice for the future flexible display technologies.

At present, polyimide (PI) is a most promising polymer material for flexible substrates. Polyimide has excellent heat resistance, radiation resistance, chemical resistance, electrical insulation, and mechanical property, but its own ability to block water and oxygen is weak. The ability to block water and oxygen for flexible polyimide substrates is usually achieved using an alternatingly stacked structure consisting of multiple layered polyimide/inorganic silicon dioxide ($SiO_2$). However, adhesion of this structure is obviously insufficient, and peeling of film layers when bending or separation of the film layers when in high temperature and high humidity is prone to occur after thin film transistors are manufactured.

Technical problem: an objective of the present disclosure is to provide a flexible substrate, a manufacturing method thereof, a display panel, and a display device to solve technical problems in current flexible substrates: a weaker ability to block water and oxygen, peeling of the film layers when bending, and separation of the film layers when in high temperature and high humidity.

SUMMARY OF THE INVENTION

An objective of the present disclosure is to provide a display panel and a manufacturing method thereof to solve technical problems in current flexible substrates: a weaker ability to block water and oxygen, peeling of the film layers when bending, and separation of the film layers when in high temperature and high humidity.

To realize the above objective, the present disclosure provides a display panel, which includes: a first flexible layer; a first barrier layer disposed on the first flexible layer; and a second flexible layer disposed on the first barrier layer; wherein, a material of the first barrier layer includes silicon oxide and silicon nitride, a mass ratio of silicon oxide to silicon nitride is $3x:7y$, and $x=1$ to 4 and $y=1$ to 4.

Further, when $x=3$ and $y=1$, the mass ratio of silicon oxide to silicon nitride is 9:7.

Further, silicon oxide is silicon dioxide, and silicon nitride is $Si_3N_4$.

Further, the display panel further includes a second barrier layer disposed on the second flexible layer.

Further, a material of the second barrier layer includes silicon oxide and silicon nitride, the mass ratio of silicon oxide to silicon nitride is $3x:7y$, and $x=1$ to 4 and $y=1$ to 4.

Further, a thickness of the first flexible layer ranges from 4000 nm to 12000 nm; and/or a thickness of the first barrier layer ranges from 100 nm to 600 nm; and/or a thickness of the second flexible layer ranges from 4000 nm to 12000 nm; and/or a thickness of the second barrier layer ranges from 100 nm to 600 nm.

Further, a sum of the thicknesses of the first flexible layer, the first barrier layer, the second flexible layer, and the second barrier layer ranges from 8200 nm to 25200 nm.

To realize the above objective, the present disclosure further provides a manufacturing method of a display panel, which includes following steps: forming a first flexible layer on a glass substrate; and forming a first barrier layer on the first flexible layer, wherein a material of the first barrier layer includes silicon oxide and silicon nitride, a mass ratio of silicon oxide to silicon nitride is $3x:7y$, and $x=1$ to 4 and $y=1$ to 4.

Further, after a step of forming a second flexible layer on the first barrier layer, the method further includes a following step: forming a second barrier layer on the second flexible layer.

Further, after the step of forming the second flexible layer on the first barrier layer, the method further includes a following step: stripping off the glass substrate from the first flexible layer by mechanical peeling and/or laser lift-off.

Beneficial effect: a technical effect of the present disclosure is that the display panel and the manufacturing method thereof are provided. The display panel includes two flexible layers and two barrier layers disposed alternatingly, which can not only improve adhesion between the two flexible layers, but also improve adhesion between the flexible layers and other film layers, thereby allowing a flexible substrate to have an ability to block water and oxygen, good adhesion, bending performance, high-temperature and high-humidity resistance, and optical transmittance.

BRIEF DESCRIPTION OF THE SEVERAL VIEWS OF THE DRAWINGS

The accompanying figures to be used in the description of embodiments of the present disclosure will be described in brief to more clearly illustrate the technical solutions of the embodiments. The accompanying figures described below are only part of the embodiments of the present disclosure, from which those skilled in the art can derive further figures without making any inventive efforts.

Figure 1:
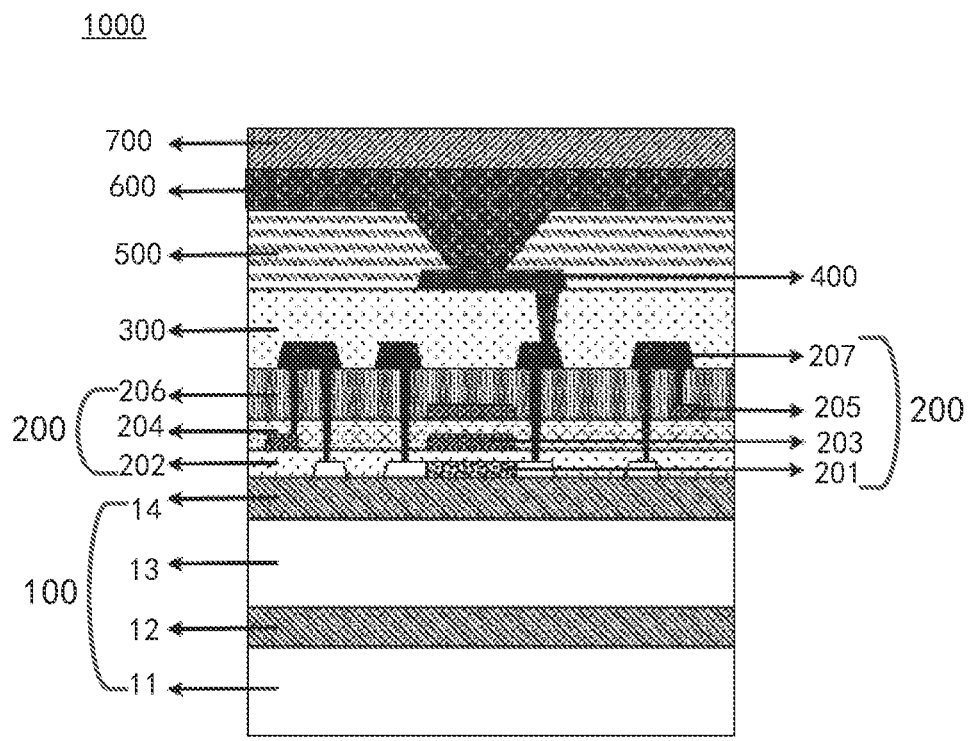
FIG. 1 is a schematic structural diagram of a display panel according to an embodiment of the present disclosure.

Elements in the drawings are designated by reference numerals listed below.

100. flexible substrate, third flexible substrate; 11. first flexible layer;
12. first barrier layer; 13. second flexible layer;
14. second barrier layer; 101. first flexible substrate;
102. second flexible substrate; 1000. display panel;
200. thin film transistor layer; 300. planarization layer;
400. anode; 500. pixel definition layer;
600. organic light-emitting layer; 700. thin film encapsulation layer;
201. active layer; 202. first gate insulating layer;
203. first gate electrode layer; 204. second gate insulating layer;
205. second gate electrode layer; 206. dielectric layer;
207. source and drain electrode layer.

DESCRIPTION OF SPECIFIC EMBODIMENTS OF THE INVENTION

The technical solutions in the embodiments of the present disclosure will be clearly and completely described below with reference to the drawings in the embodiments of the present disclosure. Obviously, the described embodiments are only a part of the embodiments of the present disclosure, but not all the embodiments. Based on the embodiments in the present disclosure, all other embodiments obtained by those skilled in the art without creative efforts are within the scope of the present disclosure. In addition, it should be understood that the specific embodiments described herein are only used to illustrate and explain the disclosure, and are not used to limit the disclosure. In the present disclosure, in the case of no explanation to the contrary, the orientation words used such as "on" and "under" usually refer to upper and lower directions of the device in actual use or working state, and specifically the directions in the drawings; and "inside" and "outside" refers to the outline of the device.

As shown in FIG. 1, FIG. 1 is a schematic structural diagram of a display panel according to an embodiment of the present disclosure.

An embodiment of the present disclosure provides a display panel 1000, which includes a flexible substrate 100, a thin film transistor layer 200, a planarization layer 300, an anode 400, a pixel definition layer 500, an organic light-emitting layer 600, and a thin film encapsulation layer 700.

Figure 2:
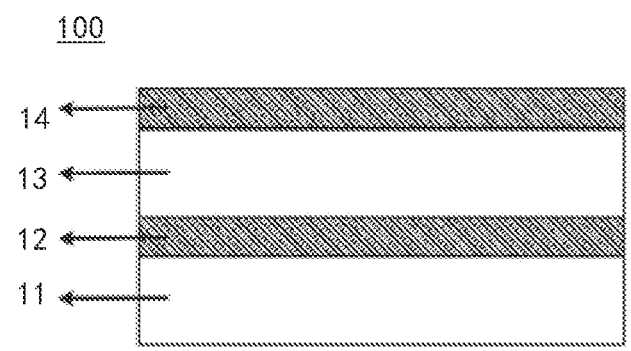
FIG. 2 is a schematic structural diagram of a flexible substrate according to an embodiment of the present disclosure.

As shown in FIG. 2, FIG. 2 is a schematic structural diagram of the flexible substrate according to an embodiment of the present disclosure.

The flexible substrate 100 includes a first flexible layer 11, a first barrier layer 12, a second flexible layer 13, and a second barrier layer 14.

The first barrier layer 12 is disposed on the first flexible layer 11, the second flexible layer 13 is disposed on the first barrier layer 12, and the second barrier layer 14 is disposed on the second flexible layer 13. Wherein, materials of the first flexible layer 11 and the second flexible layer 13 may be same or different, and are not limited herein. The materials of the first flexible layer 11 and the second flexible layer 13 may be polyimide, polymethylmethacrylate (PMMA), etc. A thickness of the first flexible layer 11 is less than or equal to a thickness of the second flexible layer 13, and is not specifically limited herein. A thickness of the first barrier layer 12 ranges from 100 nm to 600 nm, and a material of the first barrier layer 12 includes silicon oxide and silicon nitride. A thickness of the second barrier layer 14 may also range from 100 nm to 600 nm, and a material thereof may also be silicon oxide and silicon nitride. The silicon oxide includes but is not limited to $SiO_2$, and silicon nitride includes but is not limited to $Si_3N_4$. A sum of the thicknesses of the first flexible layer 11, the first barrier layer 12, the second flexible layer 13, and the second barrier layer 14 ranges from 8200 nm to 25200 nm.

In this embodiment, when a mass ratio of silicon oxide to silicon nitride is $3x:7y$, $x=1$ to 4, and $y=1$ to 4 in film-forming by chemical vapor deposition, it is beneficial to improve adhesion between the first flexible layer 11 and the second flexible layer 13, and the adhesion can be improved to 138% and above. Therefore, the flexible substrate 100 can achieve excellent bending performance and high-temperature and high-humidity resistance, and an optical transmittance can also be improved. The following is a detailed description in combination with experimental data.

Figure 3:
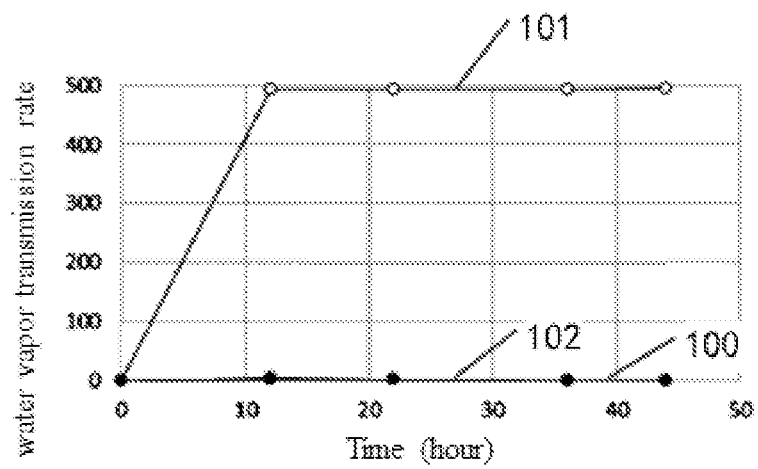
FIG. 3 is a graph showing different water vapor transmission rates corresponding to different flexible substrates according to an embodiment of the present disclosure.
Figure 4:
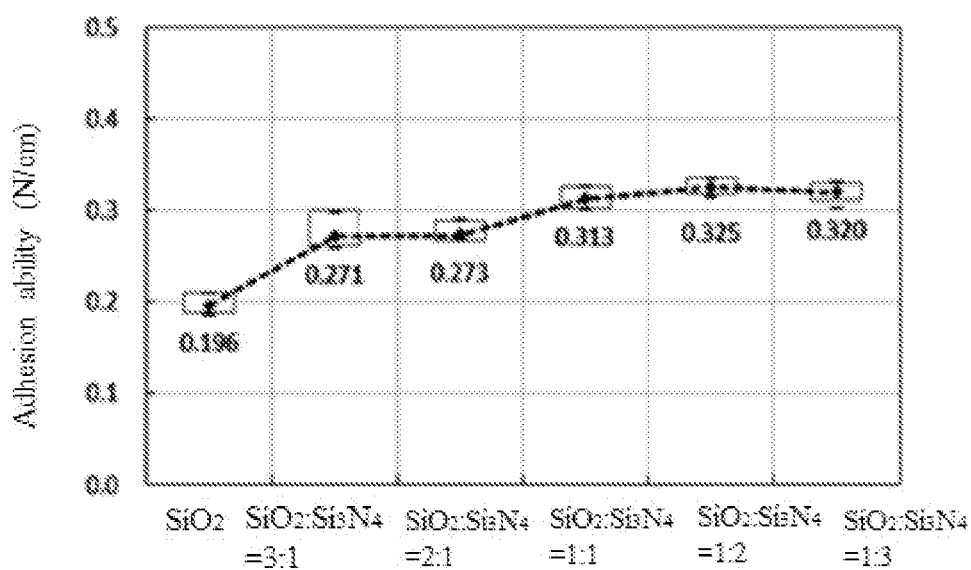
FIG. 4 is a graph showing different adhesion abilities corresponding to the different flexible substrates according to an embodiment of the present disclosure.
Figure 5:
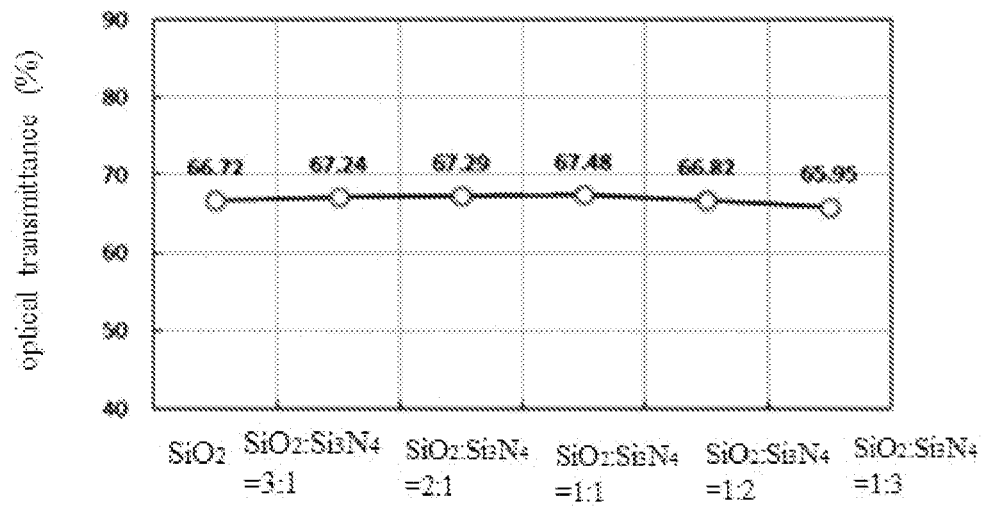
FIG. 5 is a graph showing different optical transmittances corresponding to the different flexible substrates according to an embodiment of the present disclosure.

As shown in FIGS. 3 to 5, FIG. 3 is a graph showing different water vapor transmission rates corresponding to different flexible substrates according to an embodiment of the present disclosure, FIG. 4 is a graph showing different adhesion abilities corresponding to the different flexible substrates according to an embodiment of the present disclosure, and FIG. 5 is a graph showing different optical transmittances corresponding to the different flexible substrates according to an embodiment of the present disclosure. Ratios of silicon oxide to silicon nitride in FIGS. 4 and 5 are molar ratios.

In this embodiment, the flexible substrate 100 uses a structural design of the first flexible layer 11, the first barrier layer 12, and the second flexible layer 13. Following provides three different flexible substrates, which are a first flexible substrate 101, a second flexible substrate 102, and a third flexible substrate 100, respectively. Wherein, the third flexible substrate 100 is the flexible substrate 100 provided in the present disclosure.

From FIG. 3, it can be seen that when the first flexible substrate 101 is a combination structure of one flexible layer and one barrier layer, and a material of the barrier layer is $SiO_2$ only, a water vapor transmission rate of the first flexible substrate is 500 mg/m² day. When the second flexible substrate 102 is a combination structure of two flexible layers and one barrier layer (that is, the barrier layer is disposed between the two flexible layers), and the material of the barrier layer is $SiO_2$ only, a water vapor transmission rate of the second flexible substrate 102 is 0.05 mg/m² day. When the third flexible substrate 100 is the combination structure of two flexible layers and one barrier layer (that is, the barrier layer is disposed between the two flexible layers), and the material of the barrier layer is $SiO_2$ and $Si_3N_4$, a water vapor transmission rate of the third flexible substrate is 0.05 mg/m² day. It can be seen that when the material of the barrier layer is dual ($SiO_2$) and the material of the barrier layer is dual ($SiO_2:Si_3N_4=3x:7y$), a curve of the water vapor transmission rate of the dual ($SiO_2$) basically overlaps a curve of the water vapor transmission rate of the dual ($SiO_2:Si_3N_4=3x:7y$). That is, the water vapor transmission rates of the second flexible substrate 102 and the third flexible substrate 100 are significantly less than the water vapor transmission rate of the first flexible substrate 101, which indicates that blocking abilities of the second flexible substrate 102 and the third flexible substrate 100 are quite excellent.

From FIG. 4, it can be seen that when the material of the barrier layer in both the first flexible substrate 101 and the second flexible substrate 102 are $SiO_2$, adhesion abilities (peeling forces) of the first flexible substrate 101 and the second flexible substrate 102 are 0.196. When the material of the barrier layer in the third flexible substrate 100 is $SiO_2$ and $Si_3N_4$, an adhesion ability of the third flexible substrate 100 is 0.271, which is much greater than the adhesion ability of the first flexible substrate 101 or the second flexible substrate 102. When the material used is $SiO_2$ and $Si_3N_4$, and x=3, y=1, and the mass ratio is 9:7 in film-forming by chemical vapor deposition, the adhesion ability of the third flexible substrate 100 compared to the adhesion ability of the first flexible substrate 101 or the second flexible substrate 102 is improved to 138% (that is, 0.271/0.196=138%) and above. It can be seen that the barrier layer of the present disclosure has better adhesion and can realize more excellent bending performance and high-temperature and high-humidity resistance.

As shown in FIGS. 3 to 5, when the material of the barrier layer in both the first flexible substrate 101 and the second flexible substrate 102 are $SiO_2$ (referring to FIG. 5), optical transmittances of the first flexible substrate 101 and the second flexible substrate 102 are 66.72. When the material of the barrier layer in the third flexible substrate 100 is $SiO_2$ and $Si_3N_4$, an optical transmittance of the third flexible substrate 100 ranges from 65.95 to 67.48. Therefore, the optical transmittance of the third flexible substrate 100 is basically same as the optical transmittance of the first flexible substrate 101 or the second flexible substrate 102.

When the mass ratio of silicon oxide to silicon nitride is 3x:7y, x=1 to 4, and y=1 to 4 in film-forming by chemical vapor deposition, the barrier layer has a lower water vapor transmission rate, better adhesion, and a better optical transmittance. Therefore, when this barrier layer is applied to the flexible substrate 100 and forms the first barrier layer 12, the adhesion between the first flexible layer 11 and the second flexible layer 13 can be improved, thereby allowing the flexible substrate 100 to have an excellent ability to block water and oxygen, excellent bending performance, high-temperature and high-humidity resistance, and optical transmittance. Preferably, when the material used is $SiO_2$ and $Si_3N_4$, x=3 and y=1, and the mass ratio is 9:7 in film-forming by chemical vapor deposition, the first barrier layer 12 can improve the adhesion between the first flexible layer 11 and the second flexible layer 13 to 138% and above. Therefore, the flexible substrate 100 can achieve excellent bending performance and high-temperature and high-humidity resistance, and an optical transmittance can also be improved.

Similarly, when this barrier layer is applied to the flexible substrate 100 and forms the second barrier layer 14, the second barrier layer 14 can improve adhesion between the flexible substrate 100 and other film layers, thereby improving an ability to block water and oxygen, a bending performance, high-temperature and high-humidity resistance, and an optical transmittance between the flexible substrate 100 and other film layers. Preferably, when the material used is $SiO_2$ and $Si_3N_4$ and the mass ratio is 9:7 (that is, x=3 and y=1) in film-forming by chemical vapor deposition, the second barrier layer 14 can improve the adhesion of the flexible substrate 100 to 138% and above. Therefore, excellent bending performance and high-temperature and high-humidity resistance between the flexible substrate 100 and other film layers can be achieved, and the optical transmittance can also be improved.

As shown in FIG. 1, the thin film transistor layer 200 is disposed on the flexible substrate 100. The flexible substrate 100 includes the second barrier layer 14 disposed between the thin film transistor layer 200 and the second flexible layer 13, and the second barrier layer 14 is configured to improve adhesion between the thin film transistor layer 200 and the second flexible layer 13, thereby allowing the flexible substrate 100 to attach tightly to the thin film transistor layer 200. Therefore, an ability to block water and oxygen, a bending performance, high-temperature and high-humidity resistance, and an optical transmittance between the flexible substrate 100 and the thin film transistor layer 200 can be improved.

The thin film transistor layer 200 includes an active layer 201, a first gate insulating layer 202, a first gate electrode layer 203, a second gate insulating layer 204, a second gate electrode layer 205, a dielectric layer 206, and a source and drain electrode layer 207.

The planarization layer 300 is disposed on the thin film transistor layer 200. Specifically, the active layer 201 is disposed on the second barrier layer 14. The first gate insulating layer 202 covers the active layer 201 and extends to a surface of the second barrier layer 14. The first gate electrode layer 203 is disposed on the first gate insulating layer 202 and has a plurality of first gate electrodes and first scanning lines. The first gate electrodes are disposed opposite to the active layer 201. The second gate insulating layer 204 is disposed on the first gate electrode layer 203 and extends to a surface of the first gate insulating layer 202. The second gate electrode layer 205 is disposed on the second gate insulating layer 204 and has a plurality of second gate electrodes and second scanning lines. The second gate electrodes are disposed opposite to the first gate electrodes. The dielectric layer 206 covers the second gate electrode layer 205 and extends to a surface of the second gate insulating layer 204. The source and drain electrode layer 207 is disposed on the dielectric layer 206 and penetrates through the dielectric layer 206 to connect to a surface of the active layer 201, the first scanning lines, or the second scanning lines.

The planarization layer 300 covers the source and drain electrode layer 207 and extends to a surface of the dielectric layer.

The anode 400 is disposed on the planarization layer 300 and is electrically connected to the thin film transistor layer 200. Specifically, the anode 400 is electrically connected to the source and drain electrode layer 207.

The pixel definition layer 500 is disposed on the planarization layer 300.

The organic light-emitting layer 600 is disposed on the pixel definition layer 500 and is connected to the anode 400. Specifically, the organic light-emitting layer 600 is an OLED device, which includes film layers such as an electron transport layer, an electron injection layer, a light-emitting layer, a hole injection layer, a hole transport layer, and a cathode, and one can refer to a structure of current OLED devices, which is not repeated herein.

The thin film encapsulation layer 700 is disposed on the organic light-emitting layer 600. The thin film encapsulation layer 700 includes stacked film layers formed of organic and inorganic materials, which can improve the ability to block water and oxygen and a flexible bending ability of the display panel 1000.

An embodiment of the present disclosure provides a display panel, which includes two flexible layers and two barrier layers disposed alternatingly. Therefore, not only adhesion between the two flexible layers but also adhesion between the flexible layers and other film layers can be improved. In addition, when the material of the barrier layers is silicon oxide and silicon nitride and the mass ratio of silicon oxide to silicon nitride is 3x:7y, x=1 to 4, and y=1 to 4 in film-forming by chemical vapor deposition, it is beneficial to improve adhesion of the barrier layers between the two flexible layers or adhesion of the barrier layers between the flexible layers and other film layers. Further, when the mass ratio of silicon oxide to silicon nitride is 9:7, the adhesion of the barrier layers between the two flexible layers or the adhesion of the barrier layers between the flexible layers and other film layers can improved to 138% and above. Therefore, applying the barrier layers to the display panel can allow the display panel to have better adhesion and more excellent bending performance and high-temperature and high-humidity resistance.

It should be noted that the water vapor transmission rates (WVTRs) mentioned in the embodiments refer to blocking abilities of the film layers to water vapor, the adhesion abilities (peeling force) refer to adhesion abilities of the barrier layers, and the optical transmittances refer to optical transmittances of the barrier layers.

An embodiment of the present disclosure further provides a manufacturing method of the display panel. The method includes following steps: forming the flexible substrate; forming the thin film transistor layer on the flexible substrate; forming the planarization layer on the thin film transistor layer; forming the anode on the planarization layer; forming the pixel definition layer on the planarization layer, wherein, the pixel definition layer covers the anode; forming the organic light-emitting layer on the pixel definition layer; and forming the thin film encapsulation layer on the light-emitting layer.

Figure 6:
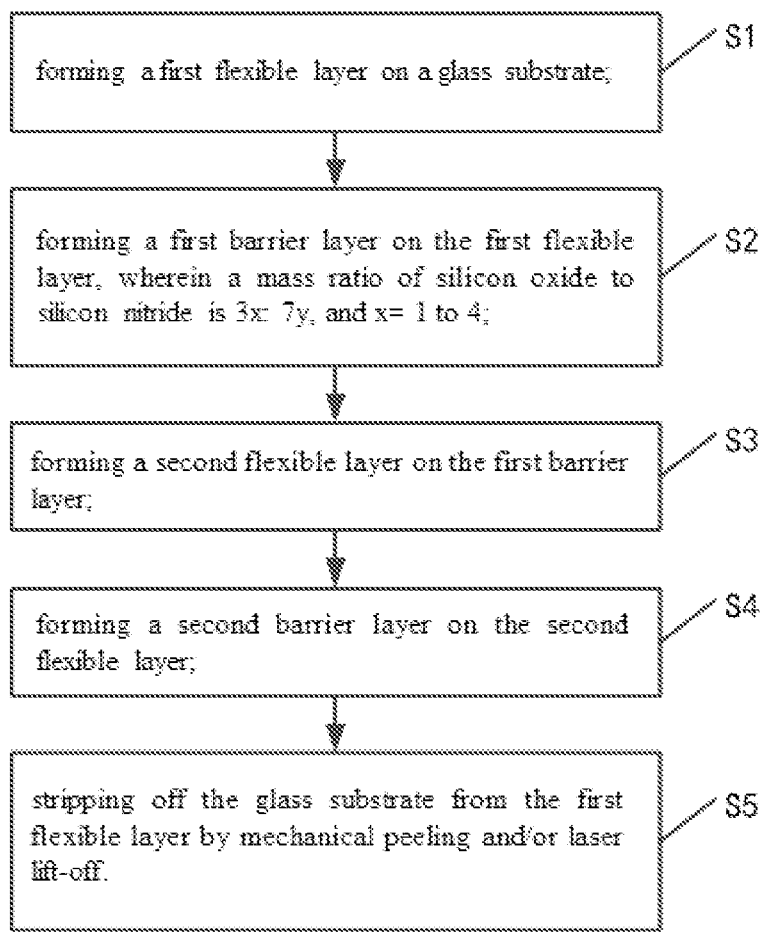
FIG. 6 is a flowchart of a manufacturing method of the flexible substrate according to an embodiment of the present disclosure.

As shown in FIG. 6, FIG. 6 is a flowchart of a manufacturing method of the flexible substrate according to an embodiment of the present disclosure.

An embodiment of the present disclosure further provides the manufacturing method of the flexible substrate, which includes following steps S1 to S4.

S1: forming the first flexible layer on a glass substrate.

Combined with FIG. 2, the material of the first flexible layer 11 may be polyimide, polymethylmethacrylate (PMMA), etc.

S2: forming the first barrier layer on the first flexible layer, wherein, the material of the first barrier layer includes silicon oxide and silicon nitride, and the mass ratio of silicon oxide to silicon nitride when film-forming by chemical vapor deposition is 3x:7y, and x=1 to 4 and y=1 to 4.

Combined with FIG. 2, the first barrier layer 12 is uniformly formed on the first flexible layer 11 by plasma-enhanced chemical vapor deposition (PECVD). The thickness of the first barrier layer 12 ranges from 100 nm to 600 nm, and the material of the first barrier layer 12 includes silicon oxide and silicon nitride.

S3: forming the second flexible layer on the first barrier layer.

Combined with FIG. 2, the material of the second flexible layer 13 may be polyimide, polymethylmethacrylate (PMMA), etc. The thickness of the first flexible layer 11 is less than or equal to the thickness of the second flexible layer 13, and is not specifically limited herein.

S4: forming the second barrier layer on the second flexible layer.

Combined with FIG. 2, the thickness of the second barrier layer 14 may also range from 100 nm to 600 nm, and the material thereof may also be silicon oxide and silicon nitride. The silicon oxide includes but is not limited to $SiO_2$, and silicon nitride includes but is not limited to $Si_3N_4$.

S5: stripping off the glass substrate from the first flexible layer by mechanical peeling and/or laser lift-off.

In this embodiment, the steps S4 and S5 can be interchanged, and is not specifically limited herein.

In this embodiment, the flexible substrate 100 uses the structural design of the first flexible layer 11, the first barrier layer 12, and the second flexible layer 13. Following provides the three different flexible substrates, which are the first flexible substrate 101, the second flexible substrate 102, and the third flexible substrate 100, respectively. Wherein, the third flexible substrate 100 is the flexible substrate 100 provided in the present disclosure.

From FIG. 3, it can be seen that when the first flexible substrate 101 is the combination structure of one flexible layer and one barrier layer, and the material of the barrier layer is $SiO_2$ only, the water vapor transmission rate of the first flexible substrate is 500 mg/m² day. When the second flexible substrate 102 is the combination structure of two flexible layers and one barrier layer (that is, the barrier layer is disposed between the two flexible layers), and the material of the barrier layer is $SiO_2$ only, the water vapor transmission rate of the second flexible substrate 102 is 0.05 mg/m² day. When the third flexible substrate 100 is the combination structure of two flexible layers and one barrier layer (that is, the barrier layer is disposed between the two flexible layers), and the material of the barrier layer is $SiO_2$ and $Si_3N_4$, the water vapor transmission rate of the third flexible substrate is 0.05 mg/m² day. It can be seen that when the material of the barrier layer is dual ($SiO_2$) and the material of the barrier layer is dual ($SiO_2:Si_3N_4=3x:7y$), the curve of the water vapor transmission rate of the dual ($SiO_2$) basically overlaps the curve of the water vapor transmission rate of the dual ($SiO_2:Si_3N_4=3x:7y$). That is, the water vapor transmission rates of the second flexible substrate 102 and the third flexible substrate 100 are significantly less than the water vapor transmission rate of the first flexible substrate 101, which indicates that blocking abilities of the second flexible substrate 102 and the third flexible substrate 100 are quite excellent.

From FIG. 4, it can be seen that when the material of the barrier layer in both the first flexible substrate 101 and the second flexible substrate 102 are $SiO_2$, the adhesion abilities (peeling forces) of the first flexible substrate 101 and the second flexible substrate 102 are 0.196. When the material of the barrier layer in the third flexible substrate 100 is $SiO_2$ and $Si_3N_4$, the adhesion ability of the third flexible substrate 100 is 0.271, which is much greater than the adhesion ability of the first flexible substrate 101 or the second flexible substrate 102. When the material used is silicon oxide ($SiO_2$) and silicon nitride ($Si_3N_4$), and a molar ratio of silicon oxide to silicon nitride is x:y=3:1 in film-forming by chemical vapor deposition, the adhesion ability of the third flexible substrate 100 compared to the adhesion ability of the first flexible substrate 101 or the second flexible substrate 102 is improved to 138% (that is, 0.271/0.196=138%) and above. It can be seen that the barrier layer of the present disclosure has better adhesion and can realize more excellent bending performance and high-temperature and high-humidity resistance.

As shown in FIGS. 3 to 5, when the material of the barrier layer in both the first flexible substrate 101 and the second flexible substrate 102 are $SiO_2$ (referring to FIG. 5), the optical transmittances of the first flexible substrate 101 and the second flexible substrate 102 are 66.72. When the material of the barrier layer in the third flexible substrate 100 is $SiO_2$ and $Si_3N_4$, an optical transmittance of the third flexible substrate 100 ranges from 65.95 to 67.48. Therefore, the optical transmittance of the third flexible substrate 100 is basically same as the optical transmittance of the first flexible substrate 101 or the second flexible substrate 102.

When the mass ratio of silicon oxide to silicon nitride is 3x:7y, x=1 to 4, and y=1 to 4 in film-forming by chemical vapor deposition, the barrier layer has the lower water vapor transmission rate, the better adhesion, and the better optical transmittance. Therefore, when this barrier layer is applied to the flexible substrate 100 and forms the first barrier layer 12, the adhesion between the first flexible layer 11 and the second flexible layer 13 can be improved, thereby allowing the flexible substrate 100 to have the excellent ability to block water and oxygen, the excellent bending performance, high-temperature and high-humidity resistance, and optical transmittance. Preferably, when the material used is $SiO_2$ and $Si_3N_4$, and the molar ratio of silicon oxide to silicon nitride is x:y=3:1 in film-forming by chemical vapor deposition, the first barrier layer 12 can improve the adhesion between the first flexible layer 11 and the second flexible layer 13 to 138% and above. Therefore, the flexible substrate 100 can achieve the excellent bending performance and high-temperature and high-humidity resistance, and the optical transmittance can also be improved.

Similarly, when this barrier layer is applied to the flexible substrate 100 and forms the second barrier layer 14, the second barrier layer 14 can improve adhesion between the flexible substrate 100 and other film layers, thereby improving the ability to block water and oxygen, the bending performance, the high-temperature and high-humidity resistance, and the optical transmittance between the flexible substrate 100 and other film layers. Preferably, when the material used is $SiO_2$ and $Si_3N_4$ and the mass ratio is 9:7 (that is, x=3 and y=1) in film-forming by chemical vapor deposition, the second barrier layer 14 can improve the adhesion of the flexible substrate 100 to 138% and above. Therefore, excellent bending performance and high-temperature and high-humidity resistance between the flexible substrate 100 and other film layers can be achieved, and the optical transmittance can also be improved.

The technical effect of the present disclosure is that the display panel and the manufacturing method thereof are provided. The display panel includes two flexible layers and two barrier layers disposed alternatingly, which can not only improve adhesion between the two flexible layers, but also improve adhesion between the flexible layers and other film layers, thereby allowing the flexible substrate to have the ability to block water and oxygen, excellent adhesion, bending performance, high-temperature and high-humidity resistance, and optical transmittance.

In addition, when the material of the first barrier layer is silicon oxide and silicon nitride and the mass ratio of silicon oxide to silicon nitride is 3x:7y, x=1 to 4, and y=1 to 4, it is beneficial to improve the adhesion of the barrier layers between the two flexible layers or adhesion of the barrier layers between the flexible layers and other film layers. Further, when the mass ratio of silicon oxide to silicon nitride is 9:7 (x=3 and y=1), the adhesion of the barrier layers between the two flexible layers or the adhesion of the barrier layers between the flexible layers and other film layers can improved to 138% and above. Therefore, applying the barrier layers to the display panel can allow the display panel to have better adhesion and more excellent bending performance and high-temperature and high-humidity resistance.

The display panel and the manufacturing method thereof provided by the embodiments of the present disclosure are described in detail above. Specific examples are used herein to explain the principles and implementation of the present disclosure. The descriptions of the above embodiments are only used to help understand the method of the present disclosure and its core ideas; meanwhile, for those skilled in the art, the range of specific implementation and application may be changed according to the ideas of the present disclosure. In summary, the content of the specification should not be construed as causing limitations to the present disclosure.

What is claimed is:

1. A display panel, comprising:
    a first flexible layer;
    a first barrier layer disposed on the first flexible layer; and
    a second flexible layer disposed on the first barrier layer;
    wherein a material of the first barrier layer comprises silicon oxide and silicon nitride, a mass ratio of silicon oxide to silicon nitride is 3x:7y, and x=1 to 4 and y=1 to 4; and
    wherein when x=3 and y=1, the mass ratio of silicon oxide to silicon nitride is 9:7.

2. The display panel according to claim 1, wherein silicon oxide is silicon dioxide, and silicon nitride is $Si_3N_4$.

3. The display panel according to claim 1, further comprising a second barrier layer disposed on the second flexible layer.

4. The display panel according to claim 3, wherein a material of the second barrier layer comprises silicon oxide and silicon nitride, the mass ratio of silicon oxide to silicon nitride is 3x:7y, and x=1 to 4 and y=1 to 4.

5. The display panel according to claim 3, wherein
    a thickness of the first flexible layer ranges from 4000 nm to 12000 nm;
    a thickness of the first barrier layer ranges from 100 nm to 600 nm;
    a thickness of the second flexible layer ranges from 4000 nm to 12000 nm; and
    a thickness of the second barrier layer ranges from 100 nm to 600 nm.

6. The display panel according to claim 3, wherein a sum of thicknesses of the first flexible layer, the first barrier layer, the second flexible layer, and the second barrier layer ranges from 8200 nm to 25200 nm.

7. A manufacturing method of a display panel, comprising following steps:
    forming a first flexible layer on a glass substrate;
    forming a first barrier layer on the first flexible layer, wherein a material of the first barrier layer comprises silicon oxide and silicon nitride, a mass ratio of silicon oxide to silicon nitride is 3x:7y, and x=1 to 4 and y=1 to 4; and
    forming a second flexible layer on the first barrier layer; wherein when x=3 and y=1, the mass ratio of silicon oxide to silicon nitride is 9:7.

8. The manufacturing method of the display panel according to claim 7, wherein after the step of forming the second flexible layer on the first barrier layer, the method further comprises a following step:
    forming a second barrier layer on the second flexible layer.

9. The manufacturing method of the display panel according to claim 7, wherein after the step of forming the second flexible layer on the first barrier layer, the method further comprises a following step:
    stripping off the glass substrate from the first flexible layer by mechanical peeling or laser lift-off.

* * * * *